(12) United States Patent
Giussani et al.

(10) Patent No.: US 10,598,733 B2
(45) Date of Patent: Mar. 24, 2020

(54) CONDITION MONITORING METHOD AND APPARATUS FOR HIGH-VOLTAGE AC ELECTRICAL SYSTEMS

(71) Applicant: High Voltage Partial Discharge Limited, Greater Manchester (GB)

(72) Inventors: Riccardo Giussani, Greater Manchester (GB); Steve Joures, Greater Manchester (GB); Alex Polley, Greater Manchester (GB); Lee Renforth, Greater Manchester (GB); Malcolm Seltzer-Grant, Greater Manchester (GB)

(73) Assignee: High Voltage Partial Discharge Limited, Greater Manchester (GB)

( * ) Notice: Subject to any disclaimer, the term of this patent is extended or adjusted under 35 U.S.C. 154(b) by 0 days.

(21) Appl. No.: 15/563,876

(22) PCT Filed: Apr. 1, 2016

(86) PCT No.: PCT/GB2016/050942
§ 371 (c)(1),
(2) Date: Oct. 2, 2017

(87) PCT Pub. No.: WO2016/156876
PCT Pub. Date: Oct. 6, 2016

(65) Prior Publication Data
US 2018/0120380 A1  May 3, 2018

(30) Foreign Application Priority Data

Apr. 1, 2015 (GB) .................................. 1505682.3
Dec. 7, 2015 (GB) .................................. 1521555.1

(51) Int. Cl.
*G01R 31/34* (2020.01)
*G01R 15/18* (2006.01)
(Continued)

(52) U.S. Cl.
CPC ......... *G01R 31/346* (2013.01); *G01R 15/186* (2013.01); *G01R 23/02* (2013.01);
(Continued)

(58) Field of Classification Search
CPC .... G01R 31/343; G01R 31/06; G01R 31/346; G01R 31/42; G01R 31/12; G01R 31/1272; G01R 23/02; G01R 15/186
See application file for complete search history.

(56) References Cited

U.S. PATENT DOCUMENTS 3,996,452 A * 12/1976 Schulze ................. B02C 25/00
                                                           700/28
6,313,640 B1    11/2001 Nasrallah et al.
(Continued)

FOREIGN PATENT DOCUMENTS

CN     2040442154 U    12/2014
WO     2012013199 A1    2/2012

*Primary Examiner* — Thang X Le
(74) *Attorney, Agent, or Firm* — Quarles & Brady LLP

(57) ABSTRACT

Monitoring apparatus for monitoring partial discharge activity in an AC electrical system comprises: a pair (60) of high- and low-frequency sensors; a timing module arranged to receive a cyclic signal from the low-frequency sensor and to provide a timing signal derived from the timing of successive cycles of the cyclic signal; and a monitoring unit (66) arranged to digitise a signal from the high-frequency sensor, to capture the digitised signal as consecutive data blocks of varying duration, and to trigger the capture of each data block in response to the timing signal. A condition monitored electrical system comprises a variable-speed drive (VSD) and a motor (M) operated by the drive, wherein the pair (60) of sensors is arranged at an end of a cable supplying power from the drive to a winding of the motor. A sensor unit (60) for condition monitoring of a high-voltage electrical system comprises a split-core current transformer with a low-frequency winding, arranged for sensing a high-voltage
(Continued)

AC waveform in a cable about which the transformer is positionable, and a high-frequency winding arranged for sensing pulses in the cable that originate from partial discharge activity.

20 Claims, 7 Drawing Sheets

(51) Int. Cl.
 *G01R 31/12* (2020.01)
 *G01R 31/06* (2006.01)
 *G01R 31/42* (2006.01)
 *G01R 23/02* (2006.01)

(52) U.S. Cl.
 CPC ......... *G01R 31/06* (2013.01); *G01R 31/1272* (2013.01); *G01R 31/343* (2013.01); *G01R 31/42* (2013.01)

(56) References Cited

U.S. PATENT DOCUMENTS

| | | | | |
|---|---|---|---|---|
| 7,420,351 | B2* | 9/2008 | Grbovic | H02M 1/4225 |
| | | | | 318/772 |
| 9,121,627 | B2* | 9/2015 | Kopko | A63B 57/00 |
| 2002/0097065 | A1 | 7/2002 | Krahn et al. | |
| 2007/0139056 | A1* | 6/2007 | Kaneiwa | G01R 31/1227 |
| | | | | 324/536 |
| 2011/0006675 | A1 | 1/2011 | Younsi et al. | |
| 2013/0191049 | A1 | 7/2013 | Casals et al. | |
| 2013/0234722 | A1* | 9/2013 | Younsi | G01R 15/185 |
| | | | | 324/509 |
| 2014/0320139 | A1 | 10/2014 | Renforth et al. | |
| 2015/0247901 | A1* | 9/2015 | Okada | G01R 31/34 |
| | | | | 324/765.01 |
| 2015/0331051 | A1* | 11/2015 | Maki | G01R 31/34 |
| | | | | 324/765.01 |
| 2017/0074920 | A1* | 3/2017 | Di Stefano | G01R 31/1272 |

* cited by examiner

Band 1 (0 - 4 kHz) Power Frequency (40 - 65 Hz) and Harmonics

Band 2 (4 - 200 kHz) Transient Events

Band 3 (0.1 - 30 MHz) OLPD Detection

CONDITION MONITORING METHOD AND APPARATUS FOR HIGH-VOLTAGE AC ELECTRICAL SYSTEMS

CROSS REFERENCE TO RELATED APPLICATIONS

This application represents the U.S. National Stage of International Application No. PCT/GB2016/050942, filed on Apr. 1, 2016 which claims priority from UK Patent Application Serial Nos. GB1505682.3, filed on Apr. 1, 2015, and GB 1521555.1, filed on Dec. 7, 2015, all of which are incorporated herein by reference for all purposes.

TECHNICAL FIELD OF THE INVENTION

The present relates to condition monitoring of high-voltage AC electrical systems, and particularly but not exclusively to adjustable-frequency electrical systems, such as on-line partial discharge monitoring of motors operated by variable-speed drives.

BACKGROUND TO THE INVENTION

Variable-speed drives (VSD)—also known as frequency converters and as inverter drives, variable-frequency drives (VFD), adjustable-speed drives (ASD), or adjustable-frequency drives (AFD)—provide an efficient means of driving electrical motors, typically achieving efficiencies of 95% or more. In VSD-fed motors, the minimal phase-displacement between voltage and current minimises reactive power requirements and associated losses. The ability to operate such motors at low speeds allows a gradual start/stop to minimise starting currents and harmful transient mechanical stresses. In pumps and compressors, the low running speeds achievable can provide very large energy savings because the power consumption varies with the cube of the operating speed.

Many large, high-voltage motors used in the oil and gas industry are VSD-driven. Often these machines are located in explosion-risk environments. In order to maintain availability of these critical machines, on-line condition monitoring technology is required. However, whilst vibration and mechanical condition monitoring technologies for these motors are well established, reliable on-line partial discharge (OLPD) monitoring to assess localised damage in the motor stator winding insulation has been more difficult to achieve. Moreover, the transient voltage spikes associated with each current pulse from the VSD inverter can present an increased risk of insulation failure and/or motor bearing erosion due to the electrical discharges that may result. Thus, there is a clear and particular need for reliable on-line partial discharge monitoring of VSD-operated motors.

However, this presents several challenges. For example, it can be difficult to distinguish partial discharge pulses from background electromagnetic interference produced by the high speed switching of the VSD's power electronics, especially since the magnitudes of switching noise transients can often dwarf those of the partial discharge pulses of interest, sometimes by a factor of ten or more. The location of many large inverter-driven motors in confined and/or hazardous locations, such as explosion-risk (Ex/ATEX) zones, can severely limit the amount of additional instrumentation that could be installed for capturing or filtering partial discharge monitoring data.

Objects of the invention therefore include the provision of a partial discharge monitoring apparatus and method that overcomes the problems outlined above; the provision of reliable hardware and/or software technologies for online partial discharge monitoring of large VSD-fed high-voltage rotating machines; and/or improved means for discriminating partial discharge activity from VSD switching noise, preferably with sufficient precision that false positives where switching interference is incorrectly identified as partial discharge activity can be avoided.

SUMMARY OF THE INVENTION

According to a first aspect of the invention, there is provided a method of monitoring partial discharge activity in an alternating current (AC) electrical system, the method comprising: providing a high-frequency signal from a high-frequency sensor arranged to sense pulses in a conductor of the system that originate from partial discharge activity; providing a low-frequency signal from a low-frequency sensor arranged to sense an AC waveform in the conductor; providing a timing signal derived from the timing of successive cycles of the low-frequency signal; and digitising the high-frequency signal and capturing the digitised signal as consecutive data blocks of varying duration, wherein the capturing of each data block is initiated by the timing signal.

Providing the timing signal may comprise providing a pulse train, detecting the timing of successive cycles of the low-frequency signal, and adjusting the timing of the pulse train to conform to the detected cycle timings. Adjusting the timing of the pulse train comprises adjusting its pulse repetition interval to match the period of successive cycles of the low-frequency signal. The rate at which the pulse repetition interval may be adjusted is preferably restricted to a predefined level. Adjusting the timing of the pulse train may comprise shifting its timing to minimise phase drift between the pulse train and the low-frequency signal. The rate at which the timing of the pulse train may be shifted is preferably restricted to a predefined level.

Providing the low-frequency signal may comprise filtering a signal from the low-frequency sensor using a low-pass filter. Providing the high-frequency and low-frequency signals may comprise receiving signals from respective high-frequency and low-frequency windings of a split-core current transformer, wherein the high-frequency and low-frequency sensors comprise, respectively, the high-frequency and low-frequency windings of the transformer. The monitoring method may comprise installing the split-core current transformer on a conductor of an AC electrical system, such as an adjustable-frequency electrical system.

The monitoring method may comprise measuring the harmonic content of the low-frequency signal, such as measuring the first 63 harmonics of the low-frequency signal. The monitoring method may further comprise producing a phase-resolved partial discharge pattern from the digitised data, wherein data from each block is phase-resolved relative to the duration of the respective block or relative to an interval detected in the timing signal at the time the respective block was digitised.

According to a second aspect of the invention, there is provided a monitoring apparatus for monitoring partial discharge activity in an AC electrical system, the monitoring apparatus comprising: a pair of sensors that comprises a high-frequency sensor and a low-frequency sensor, wherein the high-frequency sensor is arranged to sense pulses in a conductor of the system that originate from partial discharge activity, and the low-frequency sensor is arranged to sense the AC waveform in the same conductor; a timing module arranged to receive a cyclic signal from the low-frequency sensor and to provide a timing signal derived from the timing of successive cycles of the cyclic signal; and a monitoring unit arranged to digitise a signal from the high-frequency sensor, to capture the digitised signal as consecutive data blocks of varying duration, and to trigger the capture of each data block in response to the timing signal.

The monitoring apparatus may comprise a power-quality module arranged to receive a cyclic signal from the low-frequency sensor and to measure the harmonic content of the cyclic signal, such as to measure the first 63 harmonics of the cyclic signal. The monitoring apparatus may comprise a low-pass filter arranged to condition a signal from the low-frequency sensor to provide the cyclic signal to be received the timing module and/or the power-quality module.

The monitoring apparatus may comprise a plurality of pairs of sensors, each pair comprising: a high-frequency sensor arranged to sense pulses in a conductor of the system that originate from partial discharge activity, and a low-frequency sensor arranged to sense the power cycle in said conductor. The monitoring apparatus may comprise a power quality module arranged to receive a respective cyclic signal from each of the low-frequency sensors and to measure the harmonic content of said signal, such as to measure its first 63 harmonics. Respective low-pass filters may be arranged to condition the respective signals from each low-frequency sensor to provide respective cyclic signals to be received by the power quality module. The monitoring apparatus may further comprise a plurality of high-frequency sensors, each of which is arranged to sense pulses in a conductor of the system that originate from partial discharge activity.

The monitoring unit may be arranged to digitise a respective signal from each of a plurality of the high-frequency sensors simultaneously and to capture the digitised signals together in each consecutive data block, such as via a crosspoint multiplexer.

The timing module may be arranged to provide said timing signal in the form of a pulse train, to detect the timing of successive cycles in the cyclic signal, and to adjust the timing of the pulse train to conform to the detected cycle timings. The timing module may be arranged to adjust a pulse repetition interval of the timing signal to match the period of the cyclic signal, and may be arranged to limit to a predefined level the rate at which the pulse repetition interval may be increased or decreased, such as to increment or decrement the pulse repetition interval by a fixed amount. The timing module may be arranged to advance or delay the timing signal to minimise phase drift between the pulse train and the cyclic signal, and may be arranged to limit to a predefined level the rate at which the timing signal may be advanced or delayed, such as to advance or delay the timing signal by a fixed amount.

The pair of sensors, or at least one of the pairs of sensors, may comprise a split-core current transformer, wherein the high-frequency and low-frequency sensors of said pair of sensors comprise, respectively, a high-frequency winding and a low-frequency winding of the transformer.

The monitoring apparatus may be arranged to produce phase-resolved partial discharge patterns from the digitised data, wherein data from each captured block is phase-resolved relative to the duration of the respective block or relative to an interval detected in the timing signal at the time the respective block was digitised.

According to a third aspect of the invention, there is provided a condition monitored electrical system comprising a variable-speed drive, a motor operable by the drive, and monitoring apparatus according to the second aspect of the invention, wherein the pair of sensors, or at least one of the pairs of sensors, is arranged at an end of a cable supplying power from the drive to a winding of the motor.

The motor may comprise two or more windings, wherein the system comprises a respective cable supplying power from the drive to each of the windings, the monitoring apparatus comprises two or more of the pairs of sensors, and the respective pairs of sensors are arranged at an end of each said cable. The drive may provide multi-phase power, such as three-phase power, to the or each winding of the motor via a respective cable to each phase of said winding, wherein the monitoring apparatus comprises three or more of the pairs of sensors, and the respective pairs of sensors are arranged at an end of each said cable. The monitoring apparatus may comprise a plurality of the pairs of sensors, the respective pairs of sensors being arranged at both ends of the or each said cable.

The monitoring apparatus may comprise a respective partial discharge sensor mounted at both ends of the or each said cable, and may further comprise a partial discharge sensor per winding of the motor, mounted on a combined cable earth at the drive. The monitoring apparatus may further comprise a partial discharge sensor per winding of the motor, mounted on a combined cable earth at the motor. The monitoring apparatus may comprise one or more of the pairs of sensors, wherein one or more of the partial discharge sensors is a high-frequency sensor of the one or more pairs of sensors, such as wherein each of the partial discharge sensors is the high frequency sensor of a respective pair of sensors.

The monitoring apparatus may comprise a selective sensor which is sensitive to partial discharge activity occurring near the selective sensor and insensitive to conducted pulses originating from partial discharge activity elsewhere in the system, wherein the selective sensor is located at the drive or the motor. The selective sensor may be installed in a cable termination box of the drive or the motor, may be mounted on the housing of the drive or the motor, and may be located at the centre phase of a multi-phase cable feeder. The selective sensor may be a transient earth voltage (TEV) sensor.

The monitoring apparatus may comprise at least one of the selective sensors per winding of the motor, and may comprise two of the selective sensors per winding of the motor wherein one of the two selective sensors per winding is mounted at the drive and the other of the two is mounted at the motor.

According to a fourth aspect of the invention, there is provided a sensor unit for condition monitoring of a high-voltage electrical system, the sensor unit comprising a split-core current transformer with a high-frequency winding and a low-frequency winding, wherein the low-frequency winding is arranged for sensing a high-voltage AC waveform in a cable about which the transformer is positionable and the high-frequency winding is arranged for sensing pulses in the cable that originate from partial discharge activity.

The high-frequency winding and the low-frequency winding may both be arranged about the same magnetic core, such as on respective sectors of a toroidal core, and may each be arranged about respective separable parts of the magnetic core, such as about separable halves of a toroidal core.

The sensor unit may comprise a low-pass filter in connection with the low-frequency winding, such as housed within a casing of the unit. The unit may comprise an external connector arranged to provide output signals from both the high-frequency and low-frequency windings, or may comprise two external connectors arranged to provide respective output signals from the high-frequency and low-frequency windings. The unit may comprise a conductive casing, may comprise an external grounding connector, and may comprise a nonconductive silicone elastomer liner arranged to support the unit on a cable about which the unit is positionable.

A bandwidth of the low-frequency winding and/or the low-pass filter may have an upper cut-off frequency of at least 75 Hz, preferably at least 250 Hz, more preferably at least 1 kHz, more preferably at least 2 kHz, and most preferably at least 4 kHz. The bandwidth of the low-frequency winding may have a lower cut-off frequency of less than 40 Hz, more preferably less than 10 Hz, and most preferably less than 1 Hz. The bandwidth of the high-frequency winding may have an upper cut-off frequency of around 10 MHz or more, more preferably around 20 MHz or more, and most preferably around 30 MHz or more. The bandwidth of the high-frequency winding may have a lower cut-off frequency of around 1 MHz or less, preferably around 500 kHz or less, and more preferably around 200 kHz.

The first, second, third, and fourth aspects of the invention may each include any combination of one another's features.

DETAILED DESCRIPTION OF THE INVENTION

In order that the invention may be more clearly understood, embodiments thereof will now be described, by way of example only, with reference to the accompanying drawings, of which:

Figure 6:
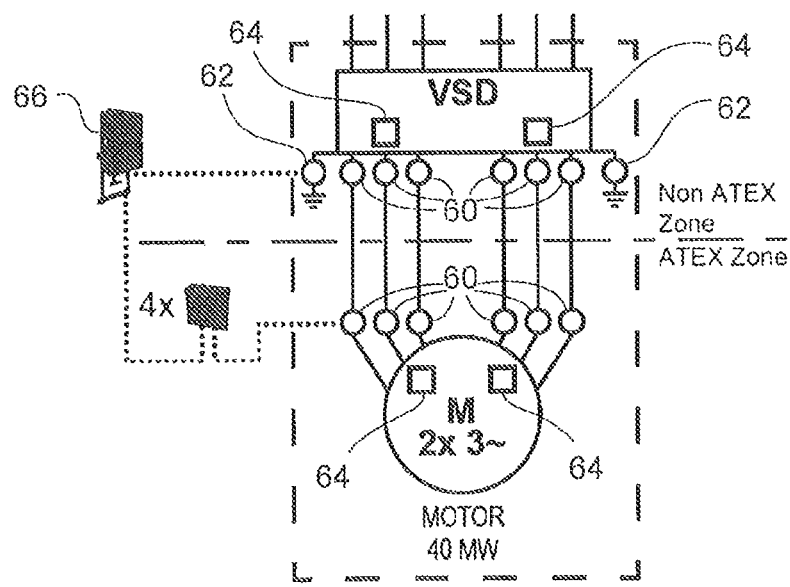
Figure 9:
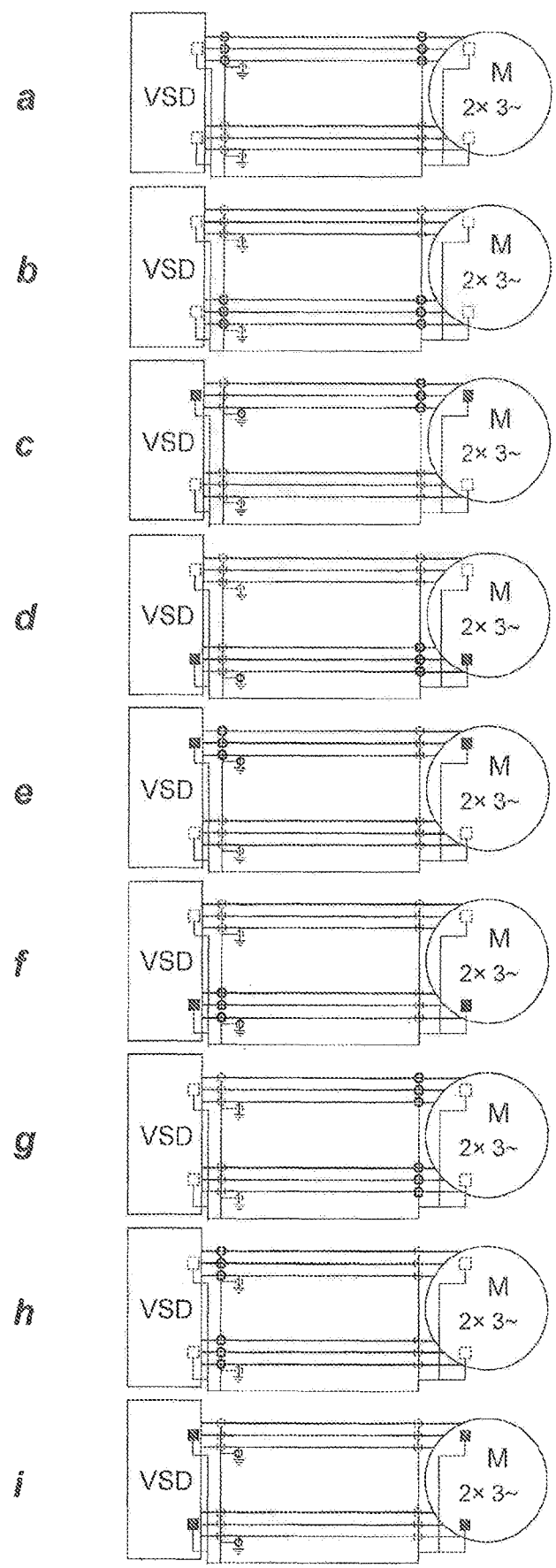
Figure 10:
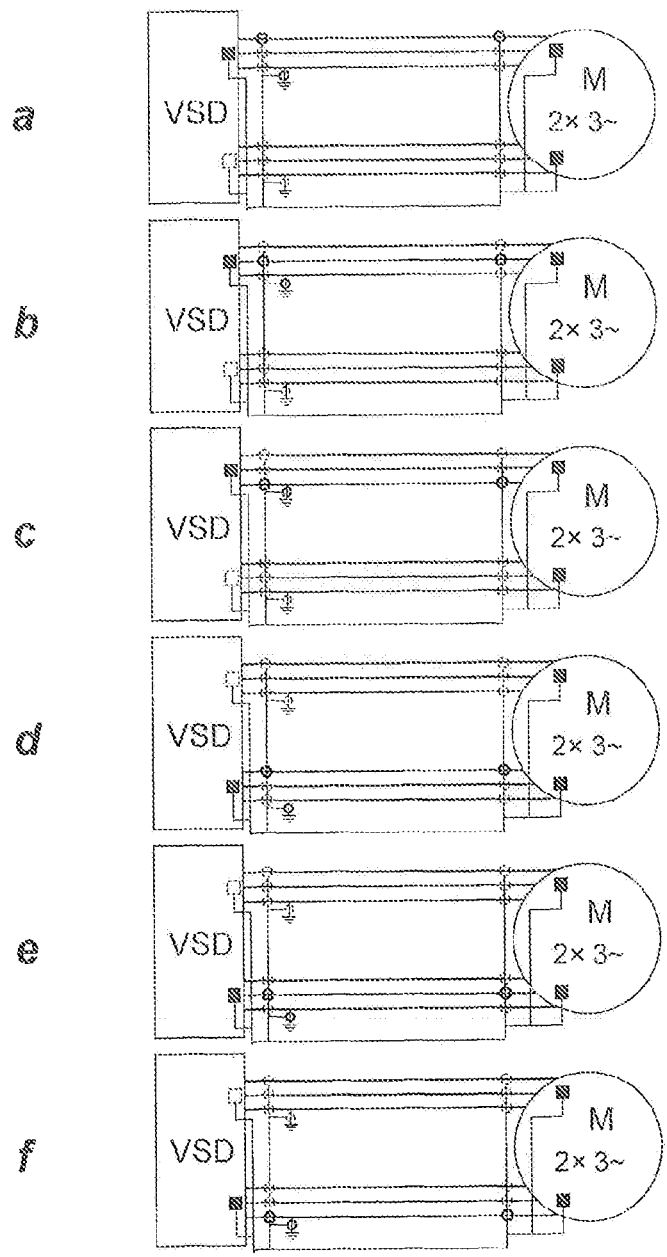
Figure 11:
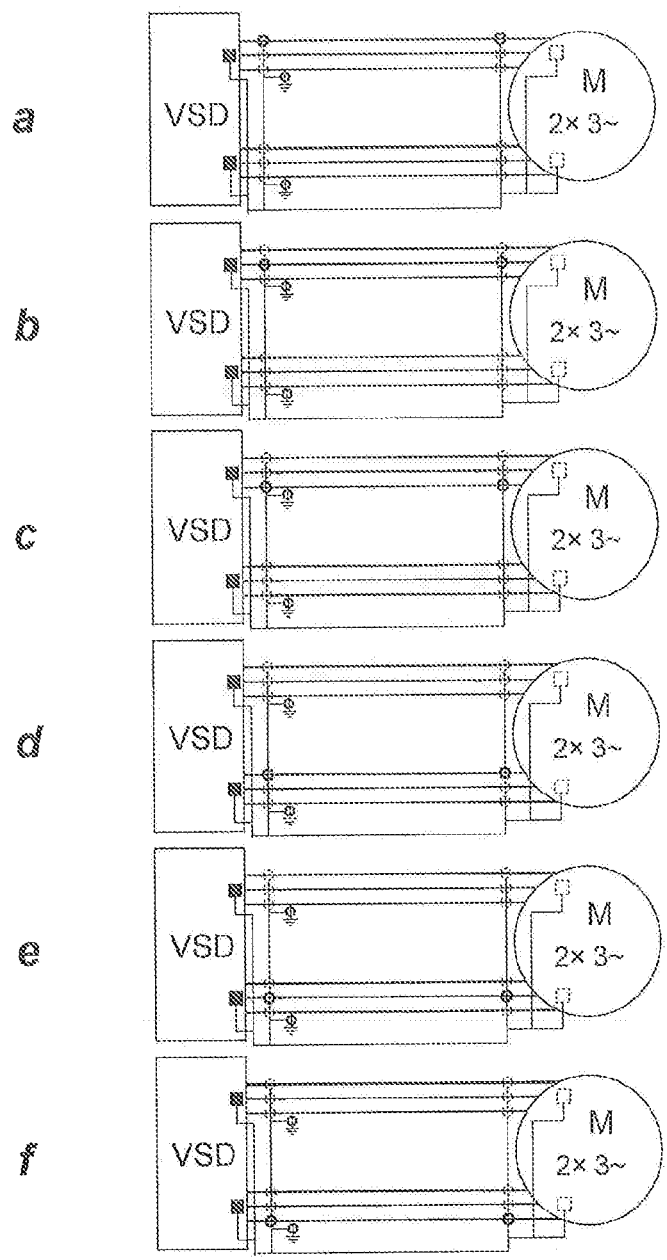

FIGS. 9-11 together illustrate a sequence of different measurements, each captured from a different combination of the sensors laid out in FIG. 6.

I. MULTI-BAND SENSOR UNIT

Figure 1:
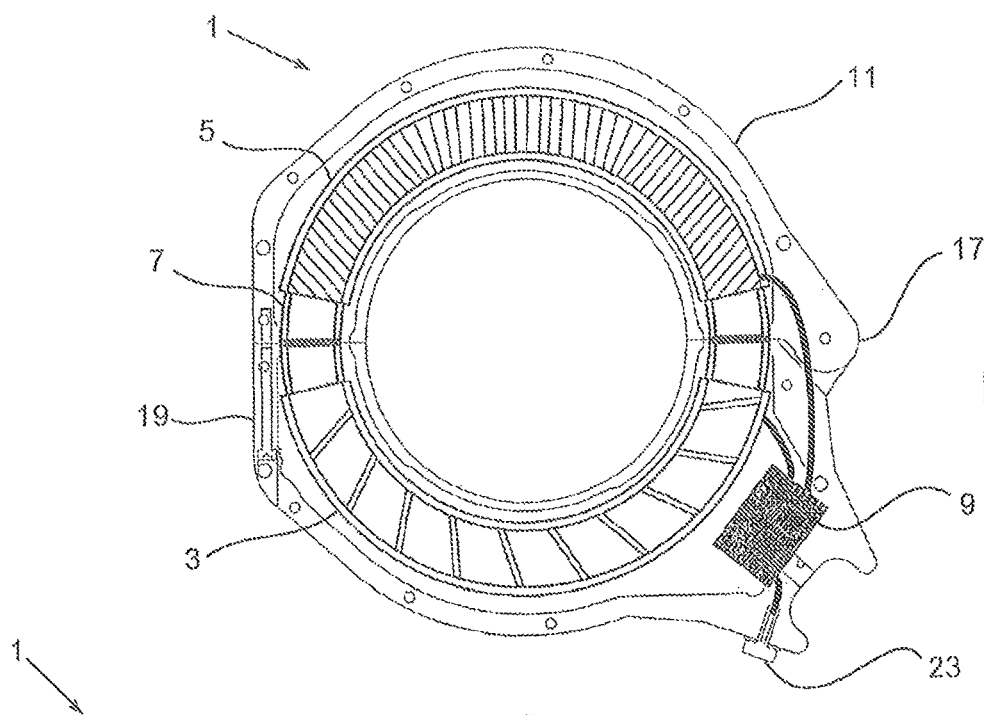
FIGS. 1-3 are views of multi-band sensor units for use in condition monitoring of high-voltage VSD-powered systems.
Figure 2:
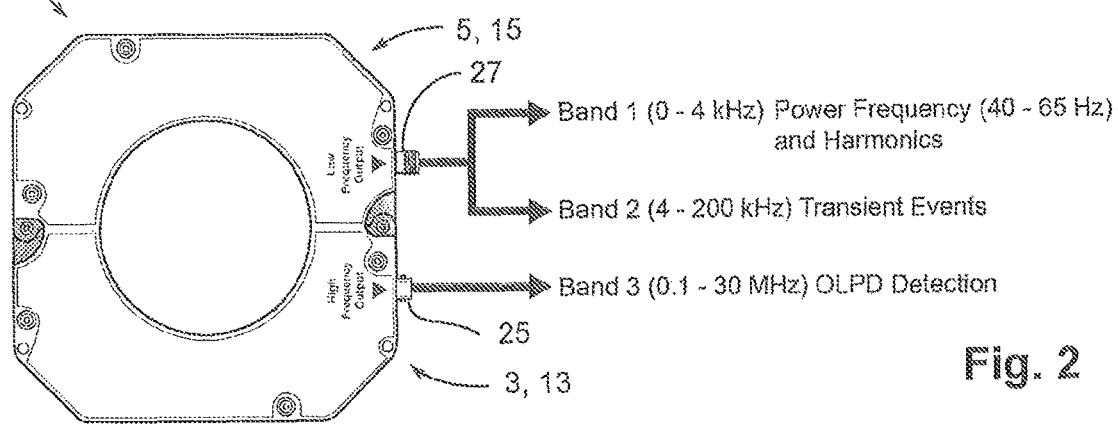
Figure 3:
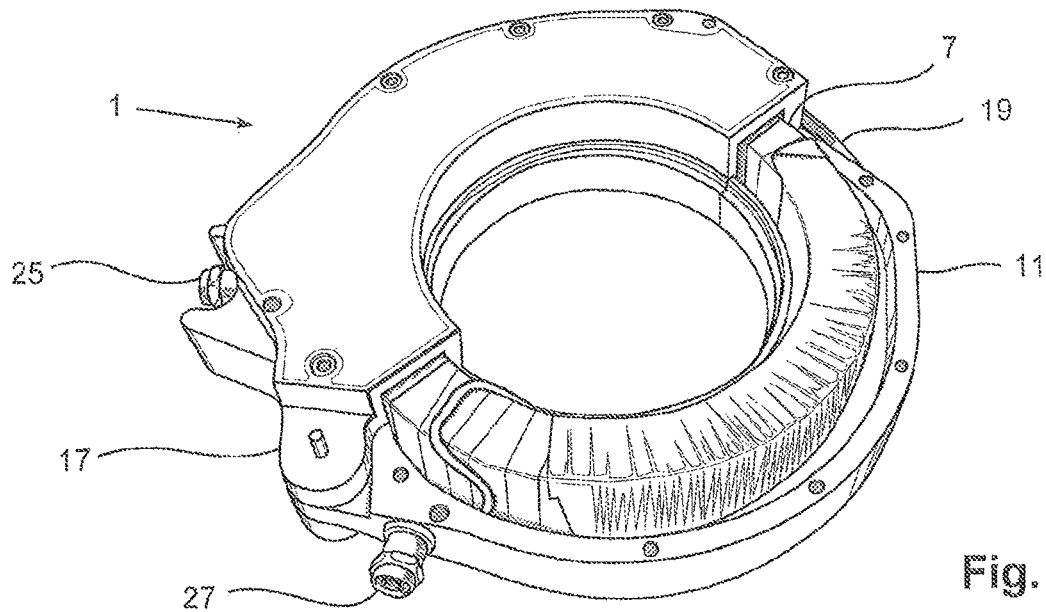

To collect wideband electrical signals (from DC up to 30 MHz) for the on-line partial discharge monitoring of a VSD-fed motor, a multi-band inductive wideband sensor was developed, embodiments of which are shown in FIGS. 1-3. The multi-band sensor is designed for attachment onto HV cables, such as at the earthed section of their terminations.

The sensor 1 comprises two windings: a high-frequency winding 3 and a low-frequency winding 5. The high-frequency winding 3 detects partial discharge pulses across the frequency range 200 kHz to 30 MHz (Band 3 in FIG. 2) and the low-frequency winding 5 detects signals from DC up 200 kHz (Bands 1 and 2). The multi-band sensor 1 can thus detect power/VSD frequency synchronization signals, power quality (PQ) and harmonics up to the 63rd order (Band 1/DC-3.5 kHz), transient events (Band 2/3.5-200 kHz) and partial discharge pulses in the frequency range 200 kHz to 30 MHz (Band 3). As a result of the sensor's good low-frequency response, it is also suitable for current signature analysis (CSA) measurements of asynchronous motor rotor condition.

The sensor unit 1 may thus be considered to comprise two separate sensors, a low-frequency (Band 1, or Bands 1 and 2) sensor 15 and a high-frequency (Band 3) sensor 13, the windings (5, 3) of each sensor (15, 13) being united by a common magnetic core 7, which is preferably a toroidal ferrite split core.

In the arrangement of FIG. 1, a passive low-pass filter 9 is integrated inside the multi-band sensor unit's casing 11 to help suppress higher frequencies (>4 kHz) from the low-frequency sensor 15 that are not relevant to power frequency or harmonic/PQ monitoring. Depending on the application, these higher/mid (Band 2) frequencies may be output via a high-pass filter, or may be disregarded so that only the power-frequency and harmonic (Band 1) and partial discharge (Band 3) signals are provided as outputs of the sensor unit. Thus, the sensor unit 1 may be a dual-band or tri-band sensor.

In certain embodiments, the unit may incorporate further passive filtering to further isolate the fundamental power frequency from its harmonics. In that case, the power frequency signal would effectively be a 'Band 0' output channel. Thus, the sensor unit 1 may be a tri-band or quad-band sensor.

In certain embodiments, the unit 1 may contain circuitry for providing a dedicated synchronisation signal, such as a pulse triggered by, or synchronised with, successive cycles of the variable-frequency AC power supply. In other embodiments, this circuitry is provided as a separate module or as part of the condition monitoring unit to which the sensor units are connected during use. A synchronisation module of this type is discussed in more detail below.

Physically, the multi-band sensor unit 1 incorporates aspects of the split-core design used in conventional high-frequency current transformer (HFCT) sensors. Separable halves of the sensor unit 1 and its ferrite core 7 are fastened by a hinge 17 on one side and a clasp 19 on the other, allowing easy installation and safe sensor retrofit installation of the sensor unit around one or more cables. This type of inductive sensor is suited to places where space is limited, such as Ex HV motor cable boxes, where it may be difficult to install other types of PD sensor such as high-voltage coupling capacitors.

The high-frequency winding 3 is located on one half of the split core and the low-frequency winding 5 is located on the other half, as shown in FIG. 1, and the filtering 9 is provided by a printed circuit board (PCB) contained within the housing 11. In the embodiment of FIG. 1, the dual-band, multi-band, or quad-band output signals are provided via a single multi-signal connector 23. In the embodiment of FIGS. 2 and 3, signals from the high-frequency (Band 3) and low-frequency (at least Band 1) windings (3, 5) are provided via separate connectors (25, 27) on respective halves of the unit.

The installation of the split-core type of inductive sensor is easier and safer than for high-voltage coupling capacitors (HVCC), and it can be installed in small HV cable boxes onto the earthed section of the HV cable terminations. Galvanic connection to the HV conductor is not required. The multi-band sensors 1 may be safely installed around the cable and earth return, below the cable-earth take-off.

The wideband frequency response of the multi-band sensor's high-frequency winding 3 (from 200 kHz to 30 MHz) makes the sensor more suitable than HVCC sensors for providing a 'noise reference signal' to help suppress switching noise from VSD pulses that occupy the lower frequency spectrum (<1 MHz). The low-frequency winding 5 provides a signal usable for detection of the VSD frequency, harmonics, and transient events, and for power-quality measurement (DC to 200 kHz).

II. SYNCHRONISATION MODULE

As described above, the multi-band sensor unit 1 may comprise a synchronisation module arranged to provide a synchronisation signal such as a regular trigger pulse synchronised with the power cycle frequency. Such a synchronisation module may alternatively be provided as a stand-alone unit for connection to a monitoring unit or as an integral part of the monitoring unit. The synchronisation module may comprise one or more microcontrollers, and may consist essentially of a microcontroller, for example.

Figure 4:
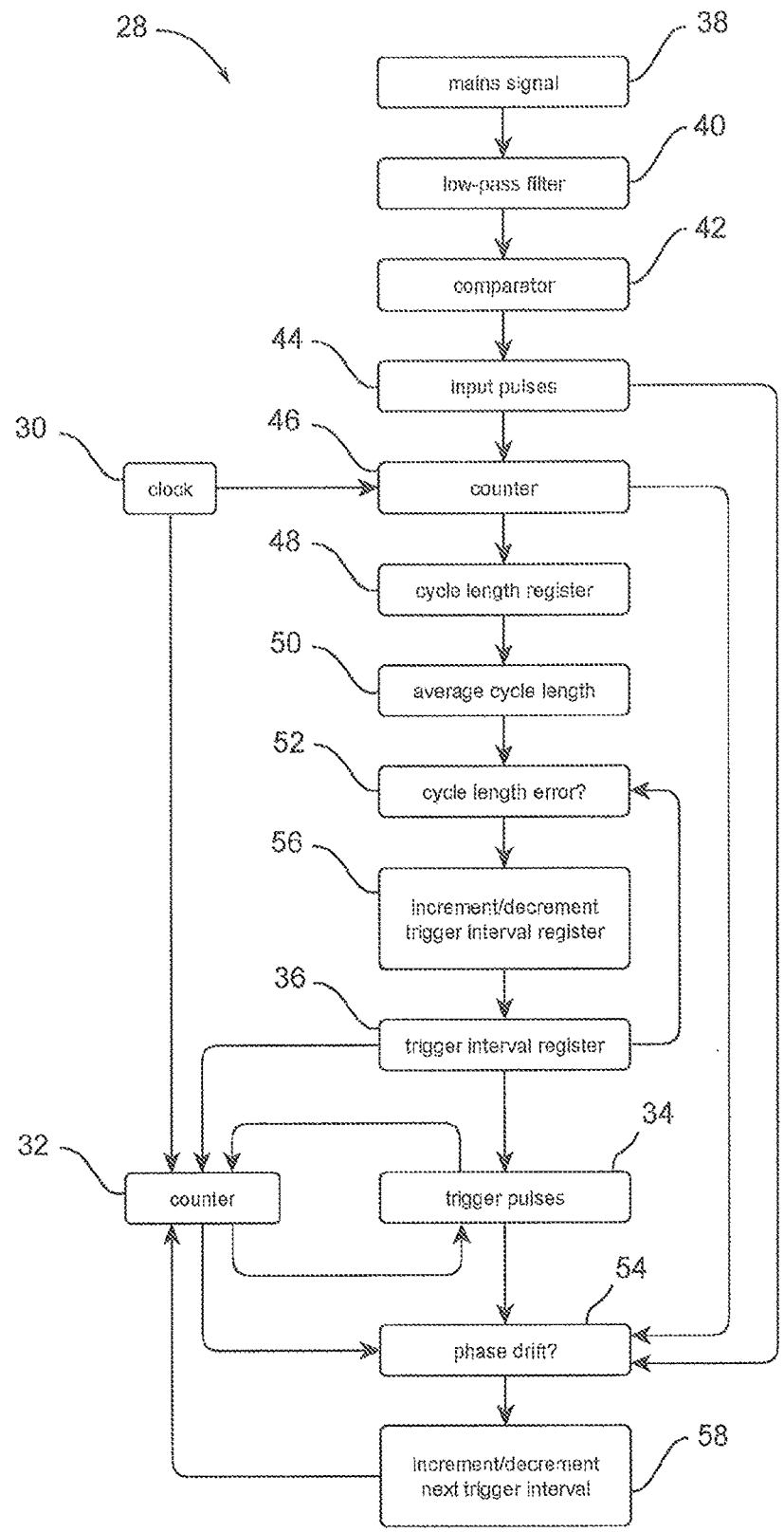
FIG. 4 is a schematic representation of a synchronisation procedure undertaken by condition monitoring apparatus for such a system.

In one arrangement, shown schematically in FIG. 4, the synchronisation module 28 uses a quartz oscillator source 30 and a free-running counter 32 to provide a train of trigger pulses 34 at regular time intervals. Each time the trigger pulse 34 occurs, the counter 32 is re-loaded with a countdown value 36 stored in a memory register. The countdown value 36 corresponds to the time interval between trigger pulses 34, and by default it is pre-set to a value corresponding to the expected or nominal period of the power cycle during normal operation of the machine being monitored. For example, for a machine expected to operate at 50 Hz during normal operation, the stored value 36 would be pre-set to a default value that provides a trigger interval of 20 ms.

The module 28 receives a signal 38 from a low-frequency current sensor, such as the low-frequency winding 5 of one of the multi-band sensor units 1 of FIGS. 1-3. Optionally, the signal 38 is filtered with a low-pass filter 40 to further reduce higher-order harmonics from the variable-speed AC power signal 38. The low-frequency signal is passed to a comparator 42 which provides an input pulse train 44 representing the zero-crossings of the mains power cycle signal 38. Alternatively, the signal 38 from the low-frequency winding 5 of a multi-band sensor unit 1 may be passed to the comparator 42 without additional filtering (beyond the low-pass filtering 9 already provided in the sensor unit 1). However, extraction of the fundamental frequency from the higher-order harmonics may help to reduce the influence of any transient distortion on the timing of the input pulses 44.

Another counter 46 is used to determine the time between successive input pulses 44, and the counter value (corresponding to the period of the fundamental frequency signal) is then recorded in a memory register 48. The average cycle length 50 over several consecutive cycles is computed and compared with the stored trigger interval 36 to provide a feedback signal 52 representing the difference between the trigger interval 36 and the detected power cycle duration 48. The two counters (32, 46) are also compared to provide another feedback signal 54 representing the phase drift between the trigger pulses 34 and the input pulses 44.

The trigger interval is then adjusted according to the feedback signals to compensate for phase drift and frequency variation. Where a difference between the power cycle length (48, 50) and trigger interval is detected, the stored trigger interval 36 is incremented or decremented (56) in the memory register (i.e. persistently) to compensate for the error. Where a phase drift between the power cycle input pulses 44 and the trigger pulses is detected, the trigger interval is incremented or decremented momentarily (58), such as by incrementing or decrementing the free-running counter 32 directly, without updating the trigger interval stored in the memory register 36.

Over time, this ensures that the trigger pulses 34 closely follow the timing of the actual power cycle 38. However, the regularity of the trigger pulses 34 provides a clean signal, unaffected by transient distortion of the power cycle waveform. To further regulate the trigger signal, adjustment 56 of the stored trigger interval 36 in response to frequency drift 52 is limited to a small predefined value, and adjustment 58 of the current trigger interval in response to phase drift 54 is similarly limited to a small predefined value, so that abrupt changes to the trigger interval are prevented. This protects the trigger signal 34 from the transient effects of jitter, short-term drift, and noise that could otherwise result in an irregular trigger pulse.

The monitoring system relies on the trigger pulse to initiate data acquisition for each power cycle, providing a consistent and well-regulated pulse train relative to which the captured data is phase-resolved.

III. INSTALLATION

Figure 5:
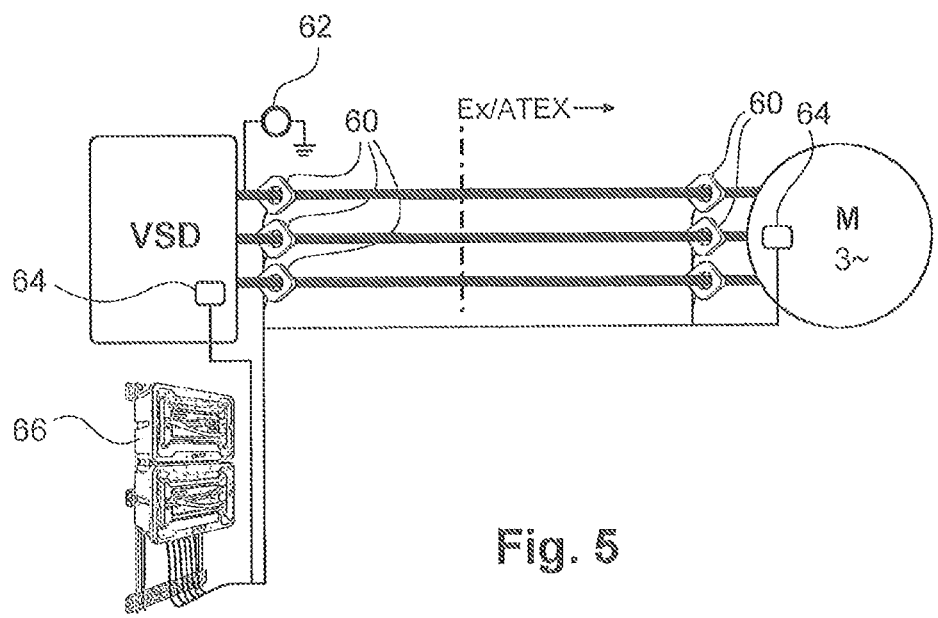
FIGS. 5-7 are schematic layouts of condition monitored VSD-powered systems.

FIG. 5 shows a variable-speed drive (VSD) supplying variable-frequency AC power to a three-phase motor (M) located in an explosion-risk (Ex/ATEX) zone. Pairs (60) of high-frequency and low-frequency sensors, preferably combined in the form of the multi-band sensor units 1 of FIGS. 1-3, are arranged at both ends of the conductors supplying high-voltage three-phase variable-frequency AC power from the inverter drive (VSD) to the windings of the motor (M). The multi-band sensors 60 are preferably mounted in the cable boxes of the VSD or motor, around the cable and earth return, below the cable-earth take-off point. In addition to the six multi-band sensors 60 arranged at opposite ends of the three cables, a seventh multi-band sensor 62 is arranged on the earth cable or grounding connector at the VSD end.

A respective capacitive transient earth voltage (TEV) sensor 64 is also located on each of the VSD and the motor, such as on or inside the housings or cable boxes of the VSD and motor. The TEV sensors 64 are preferably located near the centre of the three power cables, such as at the centre or on the centre phase of the cable feeder(s). The TEV sensors 64 are arranged to detect partial discharge pulses only where the partial discharge event from which they originate has occurred near the TEV sensor, such as within the VSD, motor housing, or cable box at which the respective TEV sensor is located.

FIG. 6 shows another VSD-powered motor. In this arrangement, the motor has twin three-phase windings (70, 72). Multi-band sensors 60 are arranged at both ends of each power cable, one pair of multi-band sensors 60 per phase, as generally described above for the arrangement of FIG. 5. In addition to the twelve multi-band sensors 60 at the cable ends, a respective multi-band sensor 62 is installed on an earth cable or grounding connector of each of the two three-phase power supply feeds (i.e. the combined earths of the respective sets of cables powering each of the two stator windings 70, 72) at the VSD end. The multi-band sensors 62 installed on the combined cable earths at the VSD end enable the detection of in-cable partial discharge activity affecting the cable sheaths.

As in the arrangement of FIG. 5, respective TEV sensors 64 are located on the VSD and the motor, such as on or inside the housings and/or preferably in the cable termination boxes.

To minimise explosion risk, the motors and the motor-end cable termination boxes are pressurised with a protective gas (known as an Ex-p system). In preferred arrangements, the multi-band sensors (60, 62) and TEV sensors 64 at the motor end are installed inside the Ex-p cable termination boxes, the sensors 60 installed on each phase being attached below the cable-earth take-off point as generally described above.

Each cable-mounted multi-band sensor unit 60 is fitted to the cable over a thick, insulating silicone elastomer collar. This centralises the sensor on the cable, providing a tight fit between the sensor and cable for good anti-vibration mounting. The conductive casing 11 of each sensor unit is grounded via an earth cable (not shown) connecting the sensors with a main copper earth bar in the cable termination box.

Each sensor (60, 62, 64) is connected to a monitoring unit 66 via a respective double-screened RG223 coaxial cable. To maintain the Ex-p rating of the motor, the coaxial cables are fed into the motor's cable termination box via sealed cable transit blocks. The signal cables are routed, alongside the power cables and/or their cable trays, to one or more point-of-attachment termination boxes 68 outside the hazardous zone (ATEX).

The attachment of sensors (60, 62, 64) in both the motor and VSD HV cable boxes allows 'precedence' analysis whereby the origin of partial discharge and other pulses can be ascertained based on which sensor(s) were first to detect the pulses that may be associated with a single partial discharge event. This technique allows partial discharge signals originating in the stator windings (70, 72) of the motor to be differentiated from pulses that originate at the VSD, such as switching noise or partial discharge events in the VSD.

Figure 7:
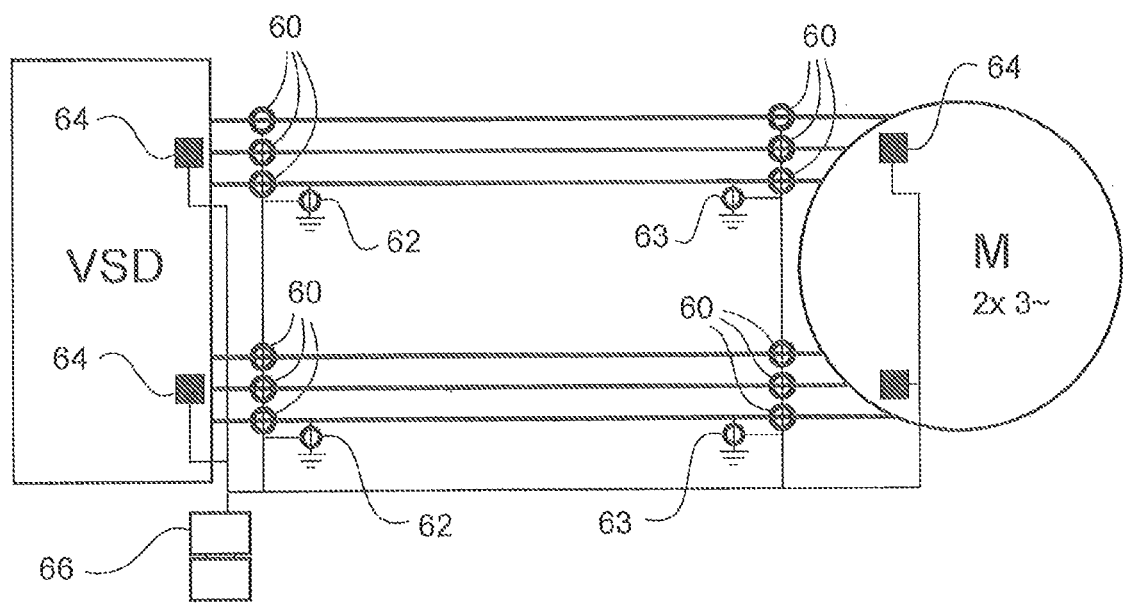

FIG. 7 shows an arrangement in which the cable-mounted multi-band sensors 60 and TEV sensors 64 are installed as per the arrangement of FIG. 6 described above. As in the arrangement of FIG. 6, a respective multi-band sensor 62 is also installed on the common earth connector of each of the two sets of three-phase cables, but in this arrangement, earth-mounted multi-band sensors (62, 63) are located at both the VSD end and the motor end. This setup has been found to enable particularly precise discrimination of partial discharge pulses from VSD switching noise.

IV. MONITORING SYSTEM

It is advantageous to select from and/or alternate between different types of PD measurement setup, particularly for pulse precedence (time-of-arrival) testing to determine the location of a PD event or noise source, and cross-phase (phase-to-phase, phase-to-earth, etc.) correlation to illuminate different types of PD event. To facilitate this, the monitoring unit comprises a computer controllable crosspoint multiplexer that allows any of its (e.g. 16, 24, or 32) input channels to be switched to any one of the (e.g. 4, 6, or 8) analogue-digital conversion channels for synchronous acquisition at a high rate. The sensor array to be used is dynamically configurable by cycling through a sequence of test setup configurations, each of which configures the crosspoint multiplexer in a different measurement configuration. Each measurement configuration in the sequence determines the selection of sensors to be monitored, and has a duration (such as a number of AC power cycles) after which the monitoring unit will proceed onto the next measurement configuration in the sequence.

The raw digitised data is captured in traces of at least one full-cycle duration (e.g. 20 ms or an integer multiple thereof when the variable AC frequency is currently 50 Hz). Waveform data segments are extracted from each raw cycle-length trace, each segment preferably having a duration in the range 5 to 50 µs, more preferably in the range 10 to 25 µs, such as around 15 µs in a preferred embodiment.

For each captured segment, parameters characterising the waveform of the pulse are computed, such as pulse rise time and fall time, pulse width (e.g. full duration at half-maximum), frequency content, pulse magnitude and polarity, and number of oscillations within a pulse. Other parameters captured may include the time-point and/or phase angle of each event segment, pulse, or peak thereof relative to the power cycle.

Figure 8:
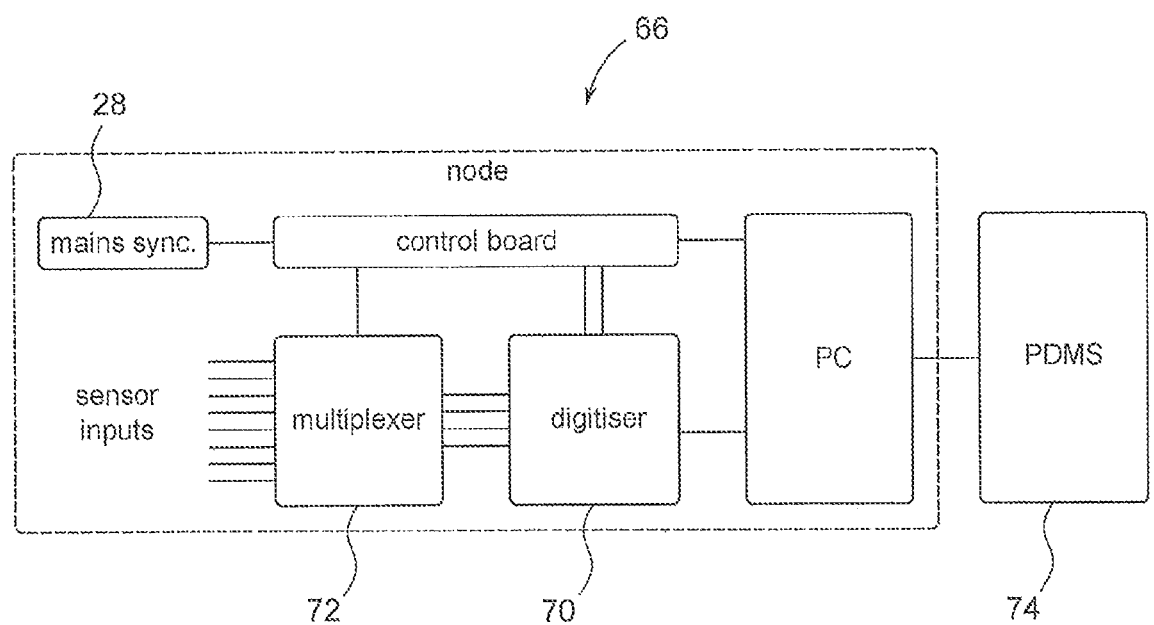
FIG. 8 is a schematic view of parts of the monitoring apparatus.

In the arrangement shown schematically in FIG. 8, the signal cabling from the sensors (60, 62, 63, 64), or at least from the TEV sensors 64 and other PD (i.e. high-frequency) sensors/windings thereof, is connected to the input channels of a monitoring unit 66. The monitoring unit 66 houses a digitiser 70 and a solid-state crosspoint multiplexer 72 capable of switching any input channel to any one of the digitisation channels. The crosspoint multiplexer 72 has at least six outputs for connection to the digitiser 70, meaning that six or more channels can be digitised simultaneously (i.e. in parallel) and synchronously, preferably within less than 10 ns of one another. This allows the origin of partial discharge events to be consistently and precisely located based on pulse arrival time, even when the VSD-motor cabling is relatively short, such as a few metres long.

The length of each signal cable connecting the sensors (60, 62, 63, 64) to the monitoring unit 66 is precisely measured, and time-domain reflectometry is used to establish its pulse propagation speed. This data is used to calibrate the digitisation or subsequent processing of each sensor channel to compensate for any lag between the different channels that is attributable to the signal cabling. Thus, signals detected at the same instant by sensors throughout the system are synchronised to within a few ns of one another once digitised.

Partial discharge monitoring signals from high-frequency sensors, such as from the high-frequency windings 3 of the multi-band sensor unit 1 of FIGS. 1-3, are captured at a sampling rate of 250 MS/s throughout the entire AC power cycle. The synchronisation module 28 provides a mains-synchronised trigger pulse 34 that initiates the capture of each power cycle, as discussed above. The timing of data in each cycle-length capture block can then be normalised by the respective cycle length or trigger pulse interval to provide phase-resolved partial discharge (PRPD) data for analysis.

The multi-channel synchronous data capture and very high sampling rate allow pulse timing to be determined with great precision. Pulses originating from noise or other non-PD sources—particularly switching noise from the VSD—are discriminated from pulses that originate from PD events based on their origin, as deduced from the arrival time of near-simultaneous pulses (such as pulses detected within the same 15 µs segment), and based on parameters derived from the waveform of relevant pulses, such as the waveform of the first detected pulse associated with a given originating event. When pulses are detected almost simultaneously, such as by the sensors at both ends of a cable, a common origin can be inferred based on which of the two pulses occurred earlier. For example, near-simultaneous pulses detected at opposite ends of the same conductor may be associated with a single originating event if the later of the two pulses has a smoother waveform and/or lower amplitude, but may be associated with separate originating events if the later pulse has a sharper waveform and/or higher amplitude. The simultaneous or near-simultaneous detection of pulses on different conductors and/or earth connectors is used to identify types of PD event, such as single-phase, phase-to-phase, and phase-to-earth types of event. This, in combination with the particular sensor arrangements set out in FIGS. 5-7, allows both the cause and the location of an event from which pulses originate to be precisely located, based on the times at which near-simultaneous pulses are detected by various sensors throughout the VSD-motor system as well as, in certain embodiments, based on selected aspects of their waveforms. For example, pulses detected by TEV sensors 64 may be classified as originating from discharge events local to the TEV sensor, whilst pulses not detected by a TEV sensor but determined to have originated at the VSD by time-of-arrival analysis may be classified as switching noise.

FIGS. 9-11 together show a sequence of different measurement configurations, each of which represents a different subset of the sensors to be selected for simultaneous digitisation and data capture, as discussed above. The monitoring unit is arranged to cycle through the configurations sequentially, although their order within the sequence may be immaterial. The measurement setups shown are based on the 18-sensor layout of FIG. 6. This sequence could of course be used with the 20-sensor configuration of FIG. 7, and preferably modified to make use of the two additional sensors 63 installed on the common earth connections at the motor end. A subset of the tests could equally be used with the 9-sensor configuration of FIG. 5.

The measurement shown in FIG. 9(a) uses the sensors 60 at both ends of each of the three conductors associated with one of the motor's windings. The measurements shown in FIGS. 9(c) and 9(e) use the common earth connection sensor 62 and the VSD-end and motor-end TEV sensors 64 associated with one of the motor's windings along with the sensors 60 at one end of each of the three conductors associated with the same winding; in FIG. 9(c) the three cable mounted sensors 60 at the motor end are used, and in FIG. 9(e) the three cable-mounted sensors 60 at the VSD end are used. FIGS. 9(b), 9(d) and 9(f) show corresponding measurements for the other winding. The measurements shown in FIGS. 9(g) and 9(h) use all six of the sensors 60 at one end of each conductor, namely the six sensors 60 at the motor end in FIG. 9(g) and those at the VSD-end in FIG. 9(h). The measurement shown in FIG. 9(i) uses all of the TEV sensors 64 and the common earth sensors 62.

The measurement shown in FIG. 10(a) uses sensors 60 at both ends of a conductor associated with one phase of one winding, along with the VSD-end TEV sensor 64 and the common earth sensor 62 associated with the same winding, and the motor-end TEV sensors 64 associated with both windings. FIGS. 10(b)-10(e) show corresponding measurements for each of the other two phases of the same winding and the three phases of the other winding, respectively.

The measurement shown in FIG. 11(a) uses sensors 60 at both ends of a conductor associated with one phase of one winding, along with the VSD-end TEV sensors 64 and common earth sensors 62 associated with both windings. FIGS. 11(b)-11(e) show corresponding measurements for each of the other two phases of the same winding and the three phases of the other winding, respectively.

For example, the measurement setups of FIGS. 9(c), 9(d), 10 and/or 11 may be particularly suitable for detecting phase-to-earth PD events in the motor; those of FIGS. 9(c)-9(f), 10 and/or 11 may be particularly suitable for detecting PD events occurring within a cable; and those of FIGS. 10 and 11 may be particularly suitable for discriminating switching noise from VSD-end PD events.

The monitoring unit may cycle repeatedly through each of the measurement configurations in sequence. In one embodiment, it is arranged to cycle through all of the configurations in sequence before selecting a smaller subset for subsequent monitoring, restarting the process periodically by cycling through all of the configurations. In another embodiment, it is arranged to cycle through one subset of the configurations for diagnostic purposes and another subset of the configurations for subsequent monitoring of diagnosed faults. For example, the unit may periodically cycle through the measurement configurations of FIG. 9 to identify particular phases that are most affected by PD events, before focusing on those phases in the intervening monitoring periods with one or more of the measurement setups selected from FIGS. 10 and 11. This adaptive selection of channels to monitor may be automated, or may be undertaken manually in response to the events detected during a preceding monitoring period, or a combination of the two.

The monitoring unit 66 is connected via Ethernet cable to a dedicated partial discharge monitoring server 74 (PDMS) which performs data storage, post processing, database management, and visualization of the results. In turn, the server may be connected to a local area network (LAN) and accessed by site reliability engineers. The server may be connected to an internet access point and is remotely accessible via a secure internet connection to facilitate remote data retrieval, analysis, reporting, and software upgrades.

The trigger interval or trigger frequency from the synchronisation module is also captured and recorded by the monitoring system, and may be periodically compared with frequency data logged by the VSD controller to confirm that the captured frequency data from both sources are consistent with one another.

A respective voltage reference waveform is captured from the low-frequency output signals of each of the cable-mounted multi-band sensors 60 installed at the VSD end, and the frequency spectrum of each waveform is computed by a power-quality software module using a fast Fourier transform with flat-top windowing. Measured power-quality parameters may include the fundamental frequency and its harmonic components. In a preferred embodiment, harmonic components up to the 63rd harmonic are captured, which for a fundamental frequency in the range 40-70 Hz would include harmonic components up to 2.5-4.4 kHz. It may be unnecessary to record the frequencies of each harmonic component, since the fundamental/power frequency and the amplitude of each of its harmonics may be sufficient to efficiently characterise the power quality.

The monitoring system is arranged to recognise partial discharge events and classify the significance or severity of those events. Event recognition and severity classification rules are based on pulse amplitudes, rise times, and other pulse wave-shape parameters, as well as on trends observed in such parameters over time. Progressive refinement of the event recognition rules based on trends observed over time, such as over timescales of days, weeks or months, allows the precision (noise rejection) of the event recognition rules to be improved so that false positives can be minimised or avoided.

The synchronous multi-channel data acquisition, combined with precisely regulated triggering of the cycle-length data acquisition, enables high-resolution phase-resolved partial discharge (PRPD) pattern analysis and crisp spatial visualisation of the data. This in turn enables filtering rules and noise rejection strategies to be more readily identified and applied—whether performing the identification and/or application manually, automatically, or a combination of the two—so that partial discharge pulses can be more readily and reliably distinguished from any remaining VSD switching noise not entirely filtered out by de-noising rules based on pulse time-of-arrival and/or waveshape analysis.

Advantageously, more than one VSD-motor pair may be selectively monitored using the same monitoring system. The monitoring unit may receive trigger signals from respective synchronisation modules associated with each of the VSD-motor pairs, so that capture of each block of digitised data is triggered by the synchronisation module associated with the selected VSD-motor pair from which signals are currently being captured. Alternatively, a synchronisation module may receive a low-frequency AC signal from each of the VSD-motor pairs, selectively providing a trigger signal based on the selected VSD-motor pair from which signals are currently being captured.

Other variations are possible. For example, airborne acoustic emission sensors may be an appropriate substitute for the TEV sensors mentioned herein. Conventional HFCT sensors may be an appropriate substitute for some of the multi-band sensor units, such as on one end of the cables if all of the power quality measurements and/or frequency synchronisation signals are being captured from multi-band sensor units 1 (or other high- and low-frequency sensor pairs) at the other end.

Although embodiments of the invention as discussed above are considered to be of particular utility in VSD-powered systems, it is envisaged that other variable-frequency AC electrical systems may advantageously be monitored using the sensors and/or frequency-synchronised monitoring methods as described herein. In particular, this may be desirable for on-line condition monitoring of electrical systems designed to operate at a notionally constant mains frequency where the true mains frequency fluctuates over time. Such frequency fluctuations will typically be orders of magnitude lower than those expected in an adjustable-frequency system, but the quality of phase-resolved partial discharge data may nevertheless be improved by maintaining synchronicity with the mains frequency.

The above embodiments are described by way of example only. Many variations are possible without departing from the scope of the invention as defined in the appended claims.

The invention claimed is:

1. A method of monitoring partial discharge activity in a motor driven by a variable-speed drive, the method comprising:
   providing a high-frequency signal from a high-frequency sensor arranged to sense pulses in a conductor of the motor driven by the variable-speed drive that originate from partial discharge activity;
   providing a low-frequency signal from a low-frequency sensor arranged to sense an AC waveform in the conductor;
   providing a timing signal derived from the timing of successive cycles of the low-frequency signal; and
   digitising the high-frequency signal and capturing it as consecutive data blocks of varying duration, wherein the capturing of each data block is triggered by the timing signal.

2. A monitoring method according to claim 1 further comprising producing a phase-resolved partial discharge pattern from the digitised data, wherein data from each block is phase-resolved relative to the duration of the respective block or relative to an interval detected in the timing signal at the time the respective block was digitised.

3. A monitoring method according to claim 1 wherein providing the timing signal comprises providing a pulse train, detecting the timing of successive cycles of the low-frequency signal, and adjusting the timing of the pulse train to conform to the detected cycle timings.

4. A monitoring method according to claim 1 wherein providing the timing signal comprises providing a pulse train, detecting the timing of successive cycles of the low-frequency signal, and adjusting the timing of the pulse train to conform to the detected cycle timings, and wherein adjusting the timing of the pulse train comprises adjusting its pulse repetition interval to match the period of successive cycles of the low-frequency signal.

5. A monitoring method according to claim 1 wherein providing the timing signal comprises providing a pulse train, detecting the timing of successive cycles of the low-frequency signal, and adjusting the timing of the pulse train to conform to the detected cycle timings, wherein adjusting the timing of the pulse train comprises adjusting its pulse repetition interval to match the period of successive cycles of the low-frequency signal, and wherein the rate at which the pulse repetition interval may be adjusted is restricted to a predefined level.

6. A monitoring method according to claim 1, wherein providing the timing signal comprises providing a pulse train, detecting the timing of successive cycles of the low-frequency signal, and adjusting the timing of the pulse train to conform to the detected cycle timings, and wherein adjusting the timing of the pulse train comprises shifting its timing to minimise phase drift between the pulse train and the low-frequency signal.

7. A monitoring method according to claim 1 wherein providing the timing signal comprises providing a pulse train, detecting the timing of successive cycles of the low-frequency signal, and adjusting the timing of the pulse train to conform to the detected cycle timings, wherein adjusting the timing of the pulse train comprises shifting its timing to minimise phase drift between the pulse train and the low-frequency signal, and wherein the rate at which the timing of the pulse train may be shifted is restricted to a predefined level.

8. A monitoring method according to claim 1 wherein providing the high-frequency and low-frequency signals comprises receiving signals from respective high-frequency and low-frequency windings of a split-core current transformer, and wherein the high-frequency and low-frequency sensors comprise, respectively, the high-frequency and low-frequency windings of the transformer.

9. A monitoring method according to claim 1 comprising measuring the harmonic content of the low-frequency signal, such as measuring the first 63 harmonics of the low-frequency signal.

10. A monitoring apparatus for monitoring partial discharge activity in a motor driven by a variable speed drive, the monitoring apparatus comprising:
   at least one pair of sensors wherein each pair of sensors has a high-frequency sensor and a low-frequency sensor, wherein the high-frequency sensor is arranged to sense pulses in a conductor of the motor driven by the variable-speed drive that originate from partial discharge activity, and the low-frequency sensor is arranged to sense the AC waveform in the same conductor;
   a timing module arranged to receive a cyclic signal from the low-frequency sensor and to provide a timing signal derived from the timing of successive cycles of the cyclic signal; and;

a monitoring unit arranged to digitise a signal from the high-frequency sensor, to capture the digitised signal as consecutive data blocks of varying duration, and to trigger the capture of each data block in response to the timing signal.

11. A monitoring apparatus according to claim 10 comprising a low-pass filter arranged to condition a signal from the low-frequency sensor to provide the cyclic signal to be received by at least one of the timing module and the power quality module.

12. A monitoring apparatus according to claim 10 comprising at least a plurality of pairs of sensors and a power quality module arranged to receive a respective cyclic signal from each of the low-frequency sensors and to measure the harmonic content of said signal, such as to measure its first 63 harmonics.

13. A monitoring apparatus according to claim 10 comprising at least a plurality of pairs of sensors and wherein the monitoring unit is arranged to digitise a respective signal from each of a plurality of the high-frequency sensors simultaneously and to capture the digitised signals together in each consecutive data block.

14. A monitoring apparatus according to claim 10 wherein at least one of the pairs of sensors, comprises a split-core current transformer, and wherein the high-frequency and low-frequency sensors of said pair of sensors comprise, respectively, a high-frequency winding and a low-frequency winding of the transformer.

15. A monitoring apparatus according to claim 14 wherein the sensors are in a unit and the high-frequency winding and the low-frequency winding are both arranged about the same magnetic core, such as on respective sectors of a toroidal core, and
    wherein the high-frequency winding and the low-frequency winding are arranged about respective separable parts of the magnetic core, such as separable halves of a toroidal core,
    the unit further comprising a low-pass filter in connection with the low-frequency winding, such as housed within a casing of the unit;
    an external connector arranged to provide output signals from both the high-frequency and low-frequency windings;
    two external connectors arranged to provide respective output signals from the high-frequency and low-frequency windings;
    a conductive casing and an external grounding connector, and
    a nonconductive silicone elastomer liner arranged to support the unit on a cable about which the unit is positionable,
    wherein the bandwidth of the low-frequency winding has a lower cut-off frequency of less than 40 Hz, and
    wherein the bandwidth of the high-frequency winding has a lower cut-off frequency of less than 1 MHz.

16. A condition monitored electrical system comprising a variable-speed drive, a motor operated by the drive, the motor having at least one winding, and monitoring apparatus for monitoring partial discharge activity in a motor driven by the variable speed drive, the monitoring apparatus comprising:
    at least one pair of sensors wherein each pair of sensors has a high-frequency sensor and a low-frequency sensor, wherein the high-frequency sensor is arranged to sense pulses in a conductor of the system that originate from partial discharge activity, and the low-frequency sensor is arranged to sense the AC waveform in the same conductor;
    a timing module arranged to receive a cyclic signal from the low-frequency sensor and to provide a timing signal derived from the timing of successive cycles of the cyclic signal; and
    a monitoring unit arranged to digitise a signal from the high-frequency sensor, to capture the digitised signal as consecutive data blocks of varying duration, and to trigger the capture of each block in response to the timing signal, and wherein at least one of the pairs of sensors, is arranged at an end of a cable supplying power from the drive to at least one winding of the motor.

17. A condition monitored electrical system according to claim 16 wherein the motor comprises at least two windings, the system comprises a respective cable supplying power from the drive to each of the windings, the monitoring apparatus comprises at least two of the pairs of sensors, and respective pairs of sensors are arranged at least at one end or both ends of each of the cables.

18. A condition monitored electrical system according to claim 16 wherein the drive provides multi-phase power, such as three-phase power, to the or each winding of the motor via a respective cable to each phase of said winding, the monitoring apparatus comprises at least three of the pairs of sensors, and the respective pairs of sensors are arranged at an end of each of the cables,
    wherein the monitoring apparatus comprises a respective partial discharge sensor mounted at each end of the or each said cable and further comprises a partial discharge sensor per winding of the motor, mounted on a combined cable earth at the drive, and
    wherein the monitoring apparatus further comprises a partial discharge sensor per winding of the motor, mounted on a combined cable earth at the motor.

19. A condition monitored electrical system according claim 16 wherein the monitoring apparatus comprises at least one selective sensor which is sensitive to partial discharge activity occurring near the selective sensor and insensitive to conducted pulses originating from partial discharge activity elsewhere in the system, and wherein the selective sensor is located at the drive or the motor,
    wherein the selective sensor is a transient earth voltage sensor, and comprises
    at least one of the selective sensors per winding of the motor.

20. A condition monitored electrical system according to claim 16 wherein the monitoring apparatus comprises a selective sensor which is sensitive to partial discharge activity occurring near the selective sensor and insensitive to conducted pulses originating from partial discharge activity elsewhere in the system, and wherein the selective sensor is located at the drive or the motor, and comprising two of the selective sensors per winding of the motor, wherein one of the two selective sensors per winding is mounted at the drive and the other of the two is mounted at the motor.

* * * * *